United States Patent
Anand et al.

(10) Patent No.: US 8,773,920 B2
(45) Date of Patent: Jul. 8, 2014

(54) REFERENCE GENERATOR WITH PROGRAMMABLE M AND B PARAMETERS AND METHODS OF USE

(75) Inventors: Darren L. Anand, Williston, VT (US); John A. Fifield, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 187 days.

(21) Appl. No.: 13/401,368

(22) Filed: Feb. 21, 2012

(65) Prior Publication Data

US 2013/0215686 A1    Aug. 22, 2013

(51) Int. Cl.
G11C 7/00    (2006.01)

(52) U.S. Cl.
USPC .............. 365/189.05; 365/189.09; 716/101; 716/132

(58) Field of Classification Search
USPC .............. 365/189.05, 189.09; 716/101, 132
See application file for complete search history.

(56) References Cited

U.S. PATENT DOCUMENTS

| | | | |
|---|---|---|---|
| 3,636,338 A | 1/1972 | Abnett et al. | |
| 5,682,117 A * | 10/1997 | Choi et al. | 327/530 |
| 6,265,858 B1 * | 7/2001 | Park | 323/313 |
| 6,556,469 B2 | 4/2003 | Birk et al. | |
| 7,309,978 B2 * | 12/2007 | Ku et al. | 323/316 |
| 7,746,959 B2 | 6/2010 | Keeth et al. | |
| 7,936,614 B2 | 5/2011 | Kim et al. | |
| 8,013,539 B2 | 9/2011 | Newman et al. | |
| 8,014,216 B2 | 9/2011 | Carey et al. | |
| 2004/0046213 A1 | 3/2004 | Hanzawa et al. | |
| 2004/0090262 A1 * | 5/2004 | Nam | 327/538 |
| 2004/0189356 A1 * | 9/2004 | Wada | 327/143 |
| 2008/0159017 A1 * | 7/2008 | Kim et al. | 365/189.09 |
| 2011/0007579 A1 | 1/2011 | Ogiwara et al. | |

* cited by examiner

*Primary Examiner* — Connie Yoha
(74) *Attorney, Agent, or Firm* — David Cain; Roberts Mlotkowski Safran & Cole, P.C.

(57) ABSTRACT

A reference generator with programmable m and b parameters and methods of use are provided. A circuit includes a first generator operable to generate a first voltage including a fraction of a supply voltage. The circuit further includes a second generator operable to generate a second voltage. The circuit further includes a mixer and buffer circuit operable to output a reference voltage including a sum of the first and second voltages.

27 Claims, 9 Drawing Sheets

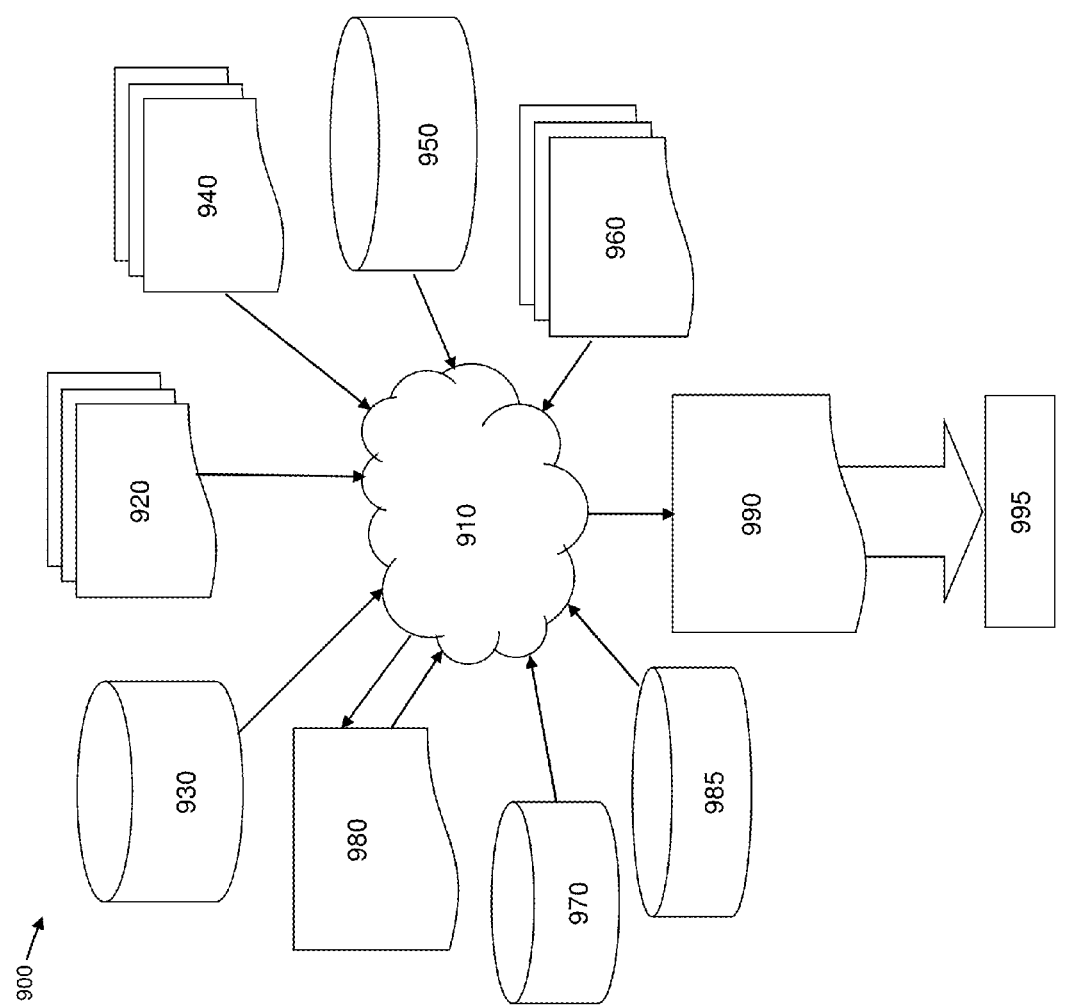

REFERENCE GENERATOR WITH PROGRAMMABLE M AND B PARAMETERS AND METHODS OF USE

FIELD OF THE INVENTION

The invention relates to reference generator systems and, more particularly, to a reference generator with programmable m and b parameters and methods of use.

BACKGROUND

In sensing a dynamic random access memory (DRAM) storage cell, it is necessary to generate a reference voltage between sense levels of "1" and "0" data types for differential sensing. More specifically, a level of the reference voltage VREF may be set to balance a signal margin between the "1" and "0" data types. For example, reference cells may be used where "0" and "1" levels are mixed, and a half-level is used to sense a DRAM data type. However, this scheme may lack an effective, predictable signal margin test. In addition, since the "1" data type may require an additional leakage margin for retention, the half-level used to sense the DRAM data type may not be optimal.

In another example, a linear voltage divider may be used to generate a VREF level equal to a fraction of a bitline power supply, and the fractional VREF level may be used to precharge reference cell capacitors. During a read operation of a DRAM, the VREF level is coupled to reference bitlines through reference cell access transistors. The VREF level may be scaled with a power supply voltage of e.g., 1 to 1.8 volts (V) in embedded DRAM (eDRAM) designs.

However, silicon on insulator (SOI) eDRAM may be designed with a floating body cell device which is susceptible to increased subthreshold leakage at high supply voltages due to a charge-up of the floating body cell device. More specifically, this increased subthreshold leakage may be due to junction leakage effects in the floating body cell device between drain and body terminals and between source and body terminals. For example, when a bitline is high (e.g., includes a write-back to another address), junction leakages may raise a body voltage in the floating body cell device. This lowers a threshold voltage of the floating body cell device, and increases leakage in the floating body cell device.

In addition, as junction and subthreshold leakages increase with a higher power supply voltage, a margin between the reference voltage and a voltage of a "0" data type may be degraded. A voltage level of a "1" data type is limited by a cell wordline level, so while the higher power supply voltage increases the "0" margin, the higher power supply voltage does not add to a margin between the reference voltage and the voltage of the "1" data type. Furthermore, scaling of the reference voltage in proportion to the power supply voltage may reduce the "1" margin as the power supply voltage increases, even though the scaling may improve the "0" margin.

Accordingly, there exists a need in the art to overcome the deficiencies and limitations described hereinabove.

SUMMARY

In a first aspect of the invention, a circuit includes a first generator operable to generate a first voltage including a fraction of a supply voltage. The circuit further includes a second generator operable to generate a second voltage. The circuit further includes a mixer and buffer circuit operable to output a reference voltage including a sum of the first and second voltages.

In another aspect of the invention, a circuit of a dynamic random access memory (DRAM), includes a reference generator operable to generate a reference voltage including a fraction of a supply voltage that is added to a direct current (DC) voltage, the reference voltage being centered between signal voltages of 1 and 0 data types of the DRAM. The circuit further includes a sense amplifier operable to sense the 1 and 0 data types based on differences between the reference voltage and the respective signal voltages.

In yet another aspect of the invention, a design structure tangibly embodied in a machine readable memory for designing, manufacturing, or testing an integrated circuit, includes a first generator operable to generate a first voltage including a fraction of a supply voltage. The design structure further includes a second generator operable to generate a second voltage. The design structure further includes a mixer and buffer circuit operable to output a reference voltage including a sum of the first and second voltages.

In another aspect of the invention, a method of optimizing semiconductor device yield and performance, includes defining signal voltages of 1 and 0 data types in a semiconductor device. The method further includes interpolating a best fit line for a reference voltage to be used by the semiconductor device, the reference voltage including a fraction of a supply voltage that is added to a direct current (DC) voltage, and the best fit line being centered between the signal voltages and including a slope and an intercept.

In yet another aspect of the invention, a method in a computer-aided design system for generating a functional design model of a reference generator with programmable m and b parameters, includes generating a functional representation of a first generator operable to generate a first voltage including a fraction of a supply voltage. The method further includes generating a functional representation of a second generator operable to generate a second voltage. The method further includes generating a functional representation of a mixer and buffer circuit operable to output a reference voltage including a sum of the first and second voltages, the reference voltage being centered between signal voltages of 1 and 0 data types of a dynamic random access memory (DRAM). The method further includes generating a functional representation of a sense amplifier operable to sense the 1 and 0 data types based on differences between the reference voltage and the respective signal voltages.

In another aspect of the invention, a design structure tangibly embodied in a machine readable storage medium for designing, manufacturing, or testing an integrated circuit is provided. The design structure comprises the circuits of the present invention. In further embodiments, a hardware description language (HDL) design structure encoded on a machine-readable data storage medium comprises elements that when processed in a computer-aided design system generates a machine-executable representation of the circuits of the present invention. In still further embodiments, a method in a computer-aided design system is provided for generating a functional design model of the circuits of the present invention. The method comprises generating a functional representation of the structural elements of the circuits of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 9 is a flow diagram of a design process used in semiconductor design, manufacture, and/or test.

DETAILED DESCRIPTION

The invention relates to reference generator systems and, more particularly, to a reference generator with programmable m and b parameters and methods of use. More specifically, in embodiments, the present invention includes a reference generator which can generate an ideal reference voltage about halfway between signal voltages of "0" and "1" data types of, e.g., an embedded dynamic random access memory (eDRAM) and other semiconductor devices which may require a reference voltage. That is, the reference generator may center the reference voltage, i.e., essentially equalize a margin between the reference voltage and the "0" signal voltage and a margin between the reference voltage and the "1" signal voltage. This may be accomplished by generating a reference voltage VREF as a linear function of a supply voltage Vdd, with a nonzero y-intercept. More specifically, in embodiments, the reference voltage VREF may be determined based on the following equation:

$$VREF = m*Vdd + b, \quad (1)$$

where m is d(VREF)/d(Vdd), or a slope of the reference voltage VREF with respect to the supply voltage Vdd, and b is a predetermined intercept of the reference voltage VREF at the supply voltage Vdd of 0 (Vdd=0).

Advantageously, using this reference voltage VREF, device yield and reliability can be increased over conventional systems. In addition, the ideal reference voltage VREF may provide sufficient difference margins with signal voltages of "0" and "1" data types of semiconductor devices, e.g., an eDRAM. Accordingly, these data types may be properly sensed by the semiconductor devices, thereby increasing the semiconductor devices' immunity from errors due to leakage.

Figure 1:
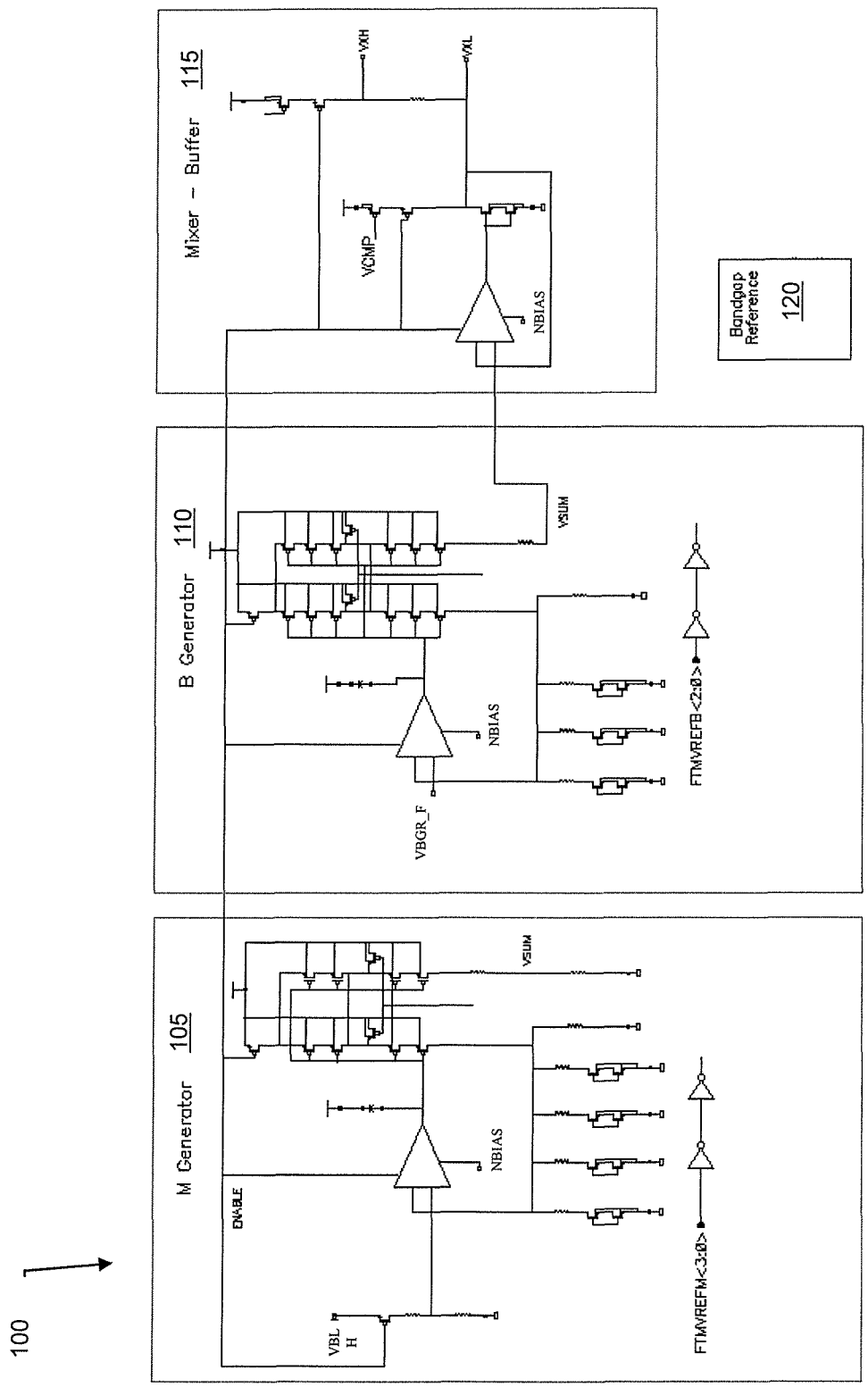
FIG. 1 is an exemplary schematic diagram of a reference generator with programmable m and b parameters in accordance with aspects of the invention.

FIG. 1 is an exemplary schematic diagram of a reference generator 100 with programmable m and b parameters in accordance with aspects of the invention. More specifically, in embodiments, the reference generator 100 can include an M generator 105, a B generator 110, a mixer/buffer 115, and a bandgap reference generator 120. The M generator 105 may include a circuit which generates an output voltage (e.g., a m voltage) at a node VSUM that is a fraction m of a bitline voltage (e.g., a supply voltage VBLH). The B generator 110 may include a circuit which generates an adjustable output voltage (e.g., a b voltage) which may be added to the output voltage at the node VSUM and may be independent of the supply voltage VBLH.

In embodiments, the mixer/buffer 115 can include a summing circuit which adds the output voltage from the M generator 105 and the adjustable output voltage from the B generator 110, at the node VSUM. The mixer/buffer 115 may further output a buffered low reference voltage VXL and a buffered high reference voltage VXH based on the added output voltages from the M generator 105 and the B generator 110. For example, in embodiments, the buffered low reference voltage VXL may include the ideal reference voltage VREF of the present invention, where VREF=m*VBLH+b, which may be a lower limit for the reference voltage VREF. The buffered high reference voltage VXH may include the ideal reference voltage VREF with an additional offset voltage of about 25 millivolts (mV), although other voltages are contemplated by the invention, which may be an upper limit for the reference voltage VREF. The buffered low reference voltage VXL and the buffered high reference voltage VXH may be output to a voltage regulator which requires upper and lower voltage values to establish an acceptable regulation range.

In accordance with further aspects of the invention, each of the M generator 105, the B generator 110, and the mixer/buffer 115 can be enabled by an enable signal voltage ENABLE. The M generator 105, the B generator 110, and their generated output voltages may be controlled by digital codes or words FTMVREFM<3:0> and FTMVREFB<2:0>, respectively. The bandgap reference generator 120 may generate additional voltages to be input into the M generator 105, the B generator 110, and the mixer/buffer 115. More specifically, in embodiments, the bandgap reference generator 120 may generate a n-type field-effect transistor (NFET) current-source mirror voltage NBIAS (e.g., of about 450 mV), a b-generator bandgap reference voltage VBGR_F, and a p-type field-effect transistor (PFET) current-source mirror voltage VCMP. These reference supplies NBIAS, VBGR_F, and VCMP may be used by the M generator 105, the B generator 110, and the mixer/buffer 115, respectively, to generate the reference voltage VREF.

Figure 2:
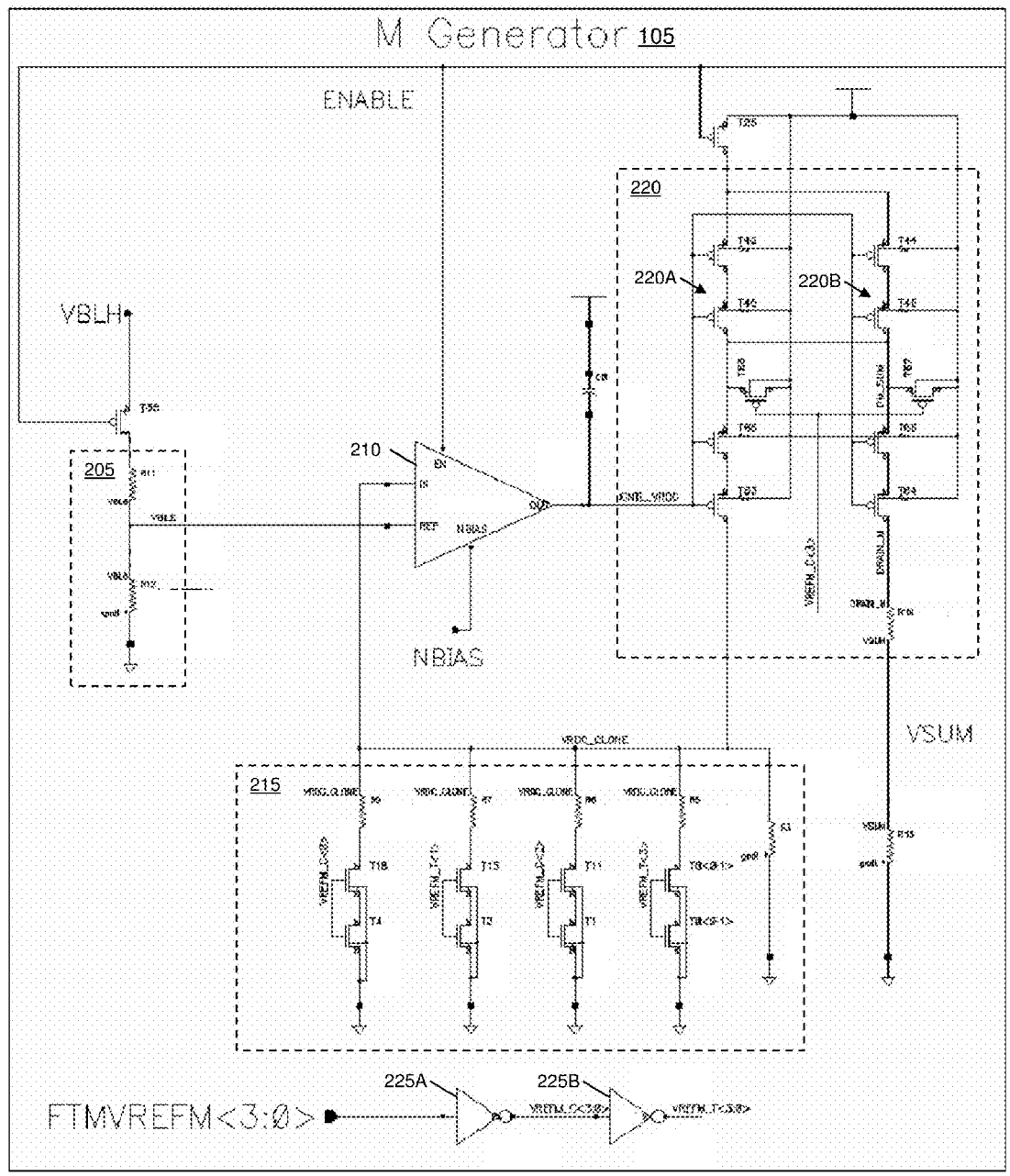
FIG. 2 is an exemplary schematic diagram of an M generator of the reference generator in FIG. 1 in accordance with aspects of the invention.

FIG. 2 is an exemplary schematic diagram of the M generator 105 in FIG. 1 in accordance with aspects of the invention. More specifically, in embodiments, the M generator 105 can include enable transistors T35 and T25, a voltage divider 205, an operational amplifier (op-amp) 210, a selectable resistor circuit 215, a compensation capacitor C0, a current supply circuit 220, inverters 225A and 225B, and a resistor R13. The enable transistors T35 and T25 may be turned on or off by the enable signal voltage ENABLE. For example, the enable transistors T35 and T25 may receive a wide range of voltage values and be turned off at high voltage values. In their off states (e.g., test modes), the enable transistors T35 and T25 may disable the M generator 105 by disabling current paths from the supply voltage VBLH to the voltage divider 205 and the current supply circuit 220.

In embodiments, the voltage divider 205 can include a resistor R11 connected in series to the enable transistor T35, and a resistor R12 connected to the resistor R11 and to ground in series. The voltage divider 205 may divide the supply voltage VBLH down to a divided voltage at a node VBL6, which is at a voltage level chosen to accommodate a common mode range of the op-amp 210. For example, in embodiments, the resistor R11 may include a value of about 13 k ohms (Ω), and the resistor R12 may include a value of about 20 k Ω. These resistors R11 and R12 may divide the supply voltage VBLH down to about 60% of the original supply voltage VBLH, e.g., a supply voltage VBLH of about 1 V down to about 0.6 V. One of ordinary skill in the art would recognize that these resistance and voltage values are only exemplary, and other resistance and voltage values may be contemplated by the invention.

In accordance with further aspects of the invention, the divided voltage at the node VBL6 can be input into a reference input REF (e.g., an inverting input) of the op-amp 210. The op-amp 210 further includes a non-inverting input IN which may be coupled to the node VRDC_CLONE which also connects the current supply circuit 220 to the selectable resistor circuit 215. The op-amp 210, the current supply circuit 220, and the selectable resistor circuit 215 are arranged in a negative feedback loop with op-amp output OUT controlling a gate voltage of PFET transistors within the current source circuit 220. By action of the negative feedback loop, the op-amp 210 adjusts the PFET gate-control voltage at a node CNT_VRDC such that sufficient current is supplied by the current supply circuit 220 to develop a voltage on the node VRDC_CLONE which is essentially equal to the VBL6 voltage present on the op-amp input node REF. The op-amp 210 may be turned on or off by the enable signal voltage ENABLE, and may receive the reference supply NBIAS which provides a source current to operate the op-amp 210.

In embodiments, the selectable resistor circuit 215 can include a ballast resistor R3 connected to the node VRDC_CLONE and to ground in series. The ballast resistor R3 is "always on" to set a maximum resistance from the node VRDC_CLONE to ground. The selectable resistor circuit 215 may further include a resistor R5 connected to the node VRDC_CLONE and to ground via transistors T6<0:1> and T0<0:1> in series. Also, a resistor R6 is connected to the node VRDC_CLONE and to ground via transistors T11 and T1 in series. A resistor R7 is connected to the node VRDC_CLONE and to ground via transistors T13 and T2 in series. A resistor R9 is connected to the node VRDC_CLONE and to ground via transistors T18 and T4 in series. For example, the resistors R3, R5, R6, R7, and R9 may be about 58 k Ω, about 29 k Ω, about 58 k Ω, about 116 k Ω, and about 232 k Ω, respectively, in value, although other resistance values are contemplated by the invention.

In accordance with further aspects of the invention, the selectable resistor circuit 215 can be used to set a current level into the node VRDC_CLONE. At each selected current level the op-amp 210 will adjust the CNT_VRDC voltage level to essentially equate the voltage on node VRDC_CLONE with the divided voltage at the node VBL6. The current level into the node VRDC_CLONE may include a value in a range between about 10 microamps (μA) to about 50 μA. More specifically, in embodiments, each of the resistors R5, R6, R7, and R9 may be selected to affect (e.g., decrease, or increase) the current level into the node VRDC_CLONE. To select at least one of the resistors R5, R6, R7, and R9, respective digital bits of the digital code FTMVREFM<3:0> may be set. That is, the digital bits FTMVREFM<3>, FTMVREFM<2>, FTMVREFM<1>, and FTMVREFM<0> may be set to select the resistors R5, R6, R7, and R9, respectively.

More specifically, in embodiments, the inverters 225A and 225B can convert the digital code FTMVREFM<3:0> to the respective analog control-signal voltages VREFM_C<3:0> and VREFM_T<3:0>. When set, these analog control-signal voltages VREFM_C<3:0> and VREFM_T<3:0> can turn on the transistors T6<0:1>, T0<0:1>, T11, T1, T13, T2, T16, and T4, respectively. When the transistors T6<0:1>, T0<0:1>, T11, T1, T13, T2, T16, and T4 are turned on, the respective resistors R5, R6, R7, and R9 may be selected (e.g., connected to ground) such that the resistors R5, R6, R7, and R9 may affect the current into the node VRDC_CLONE. As more of the resistors R5, R6, R7, and R9 are selected, the current level into the node VRDC_CLONE increases. As fewer of the resistors R5, R6, R7, and R9 are selected, the current level into the node VRDC_CLONE decreases.

In accordance with further aspects of the invention, regardless of how much current is flowing into the node VRDC_CLONE, the op-amp 210 defines a gate control voltage to control PFET current sources within the current supply circuit 220 such that the voltage on the node VRDC_CLONE is essentially equal to node VBL6. The compensation capacitor C0 may be included to maintain adequate phase margin for the negative feedback loop formed by the op-amp 210, the current supply circuit 220, and the selectable resistor circuit 215 to insure AC stability, i.e., prevent oscillations and allow the voltages and currents associated with the M generator 105 to become DC stable and steady state.

In embodiments, the current supply circuit 220 can include transistors T42, T44, T45, T46, T63, T64, T65, and T66, which may be, e.g., PFETs of a medium channel length, e.g., of about 490 nm. The transistors T42, T45, T65, and T63 may be stacked in series, and may be a first current source 220A which generates a first current to be directed into the node VRDC_CLONE. The transistors T44, T46, T66, and T64 may be stacked in series, and may be a second current source 220B which is identical to the first current source 220A in that the second current source 220B also generates a second current proportional to the current level into the node VRDC_CLONE.

In accordance with further aspects of the invention, in contrast to the first current source 220A, the second current source 220B can direct the second current into the node DRAIN_M. Although each of the first current source 220A and the second current source 220B is shown herein to include four transistors stacked in series, one of ordinary skill in the art would recognize that each of the first current source 220A and the second current source 220B may include any number of transistors to generate more linear currents. For example, each of the first current source 220A and the second current source 220B may include a single transistor of a longer channel length (e.g., of about 2 μm), or whatever length which provides an essentially flat saturation region.

In embodiments, the current supply circuit 220 can further include transistors T67 and T68, which may be, for example, PFETs, to improve operation of the first current source 220A and the second current source 220B over a high-to-low current range. More specifically, in embodiments, the transistors T42, T44, T45, T46, T63, T64, T65, and T66 may be sensitive to threshold voltage mismatches at low current levels, as overdrive decreases. Accordingly, the transistors T67 and T68 may act as shunt devices to shunt or short off the transistors T42, T44, T45, and T46, in a high current-mode range, thereby increasing effective PFET widths of the first current source 220A and the second current source 220B. Conversely, in a low current-mode range, the shunt transistors T67 and T68 are turned off causing the effective PFET width to be reduced by inclusion of the transistors T42, T44, T45 and T46. The turn-on and turn-off of the shunt transistors T67 and T68 are coordinated such that a low effective PFET width is in effect when the current supply circuit 220 is in the low current-mode range. This may further reduce the effect of threshold voltage mismatches in all of the transistors T42, T44, T45, T46, T63, T64, T65, and T66, and may force the remaining, actively operating transistors to function with higher overdrive. The transistors T67 and T68 may be operated (e.g., turned on or off) by the high-range analog control-signal voltage VREFM_C<3> such that the overdrive of the transistors T44, T45, T46, T63, T64, T65, and T66 is increased for low digital-to-analog (DAC) ranges, such as when the digital code FTMVREFM<3:0> is 0, 0, 0, and 0, respectively.

In accordance with further aspects of the invention, the current supply circuit 220 can further include a resistor R19 connected to the node DRAIN_M and the node VSUM in series. The resistor R19 may modulate a voltage level at the node DRAIN_M, e.g., a drain of the transistor T64 to improve current linearity between the current sources 220A and 220B. The current supply circuit 220 may generate an output voltage (e.g., the m voltage) at the node VSUM and across the resistor R13. This output voltage or m voltage at the node VSUM may include a range between about 0.1*VBLH and about 0.475*VBLH, although other ranges and voltage values may be contemplated by the invention. The current supply circuit 220 may generate an output voltage which includes a range of about 0.1*X to about 0.475*X, where X is an input voltage into the M generator 105, although other ranges and current values may be contemplated by the invention.

Figure 3:
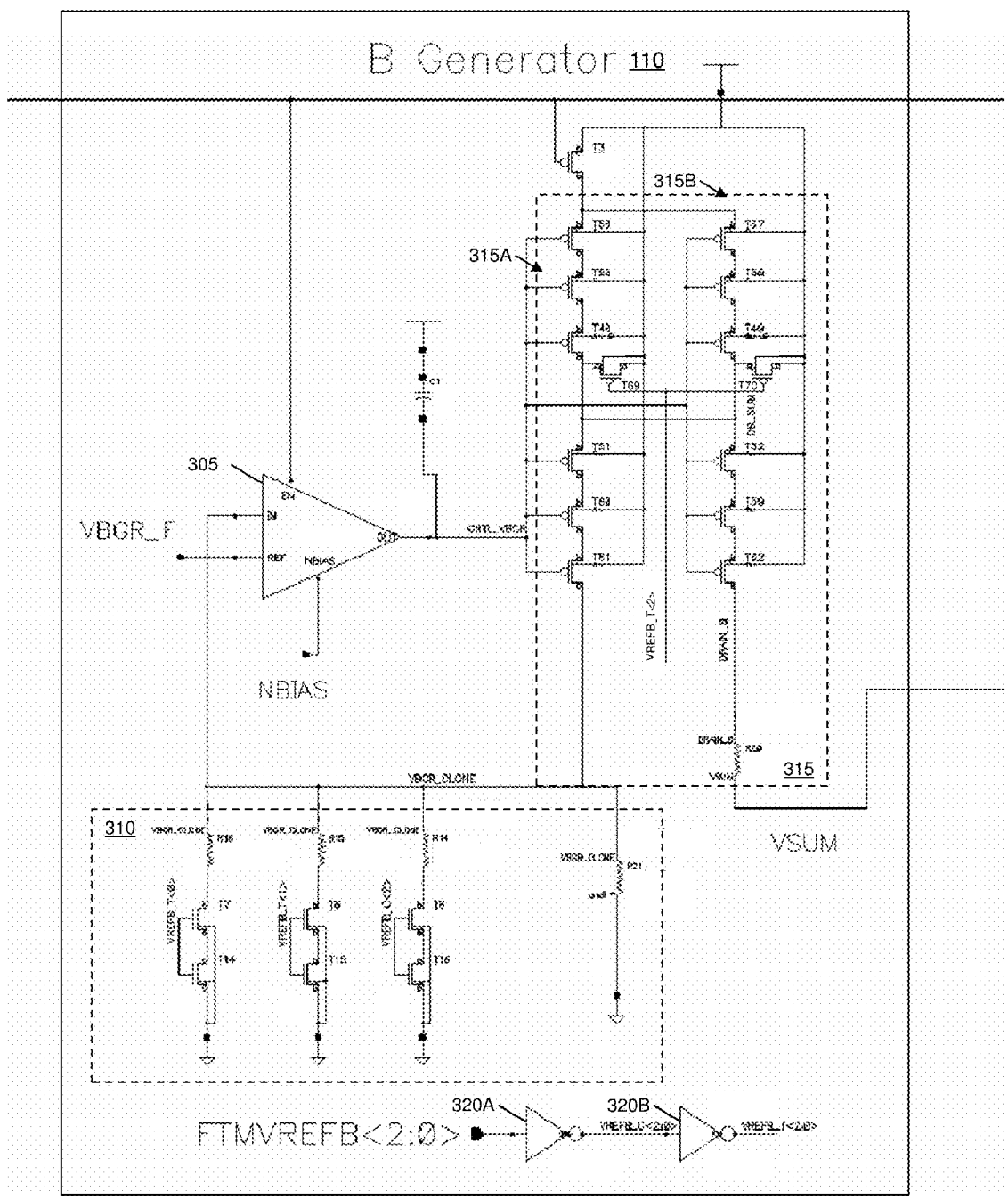
FIG. 3 is an exemplary schematic diagram of a B generator of the reference generator in FIG. 1 in accordance with aspects of the invention.

FIG. 3 is an exemplary schematic diagram of the B generator 110 in FIG. 1 in accordance with aspects of the invention. More specifically, in embodiments, the B generator 110 can include an enable transistor T3, an operational amplifier (op-amp) 305, a selectable resistor circuit 310, a compensation capacitor C1, a current supply circuit 315, and inverters 320A and 320B. The enable transistor T3 may be turned on or off by the enable signal voltage ENABLE. In its off state, the enable transistor T3 may disable the B generator 110 by disabling a current path from the supply voltage VBLH to the current supply circuit 315.

In embodiments, the reference supply VBGR_F from the bandgap reference generator 120 in FIG. 1 can be input into a reference input REF (e.g., an inverting input) of the op-amp 305. The reference supply VBGR_F may include a stable direct current (DC) voltage, and a value in a range between about 0.5 V and about 0.7 V, although other ranges and voltage values may be contemplated by the invention. The op-amp 305 further includes a non-inverting input IN which may be coupled to the node VBGR_CLONE which also connects the current supply circuit 315 to the selectable resistor circuit 310. The op-amp 305, the current supply circuit 315 and the selectable resistor circuit 310 are arranged in a negative feedback loop with op-amp output OUT controlling a gate voltage of PFET transistors within the current supply circuit 315. By action of the negative feedback loop, the op-amp 305 adjusts the PFET gate-control voltage at a node CNTL_VBGR such that sufficient current is supplied by the current supply circuit 315 to develop a voltage on the node VBGR_CLONE which is essentially equal to the VBGR voltage present on the op-amp input node REF. The op-amp 305 may be turned on or off by the enable signal voltage ENABLE, and may receive the reference supply NBIAS which provides a source current to operate the op-amp 305.

In accordance with further aspects of the invention, the selectable resistor circuit 310 can include a ballast resistor R21 connected to the node VBGR_CLONE and to ground in series. The ballast resistor R21 is "always on" to set a maximum resistance from the node VBGR_CLONE to ground.

The selectable resistor circuit 310 may further include a resistor R14 connected to the node VBGR_CLONE and to ground via transistors T9 and T16 in series. Also, a resistor R15 is connected to the node VBGR_CLONE and to ground via transistors T8 and T15 in series. A resistor R16 is connected to the node VBGR_CLONE and to ground via transistors T7 and T14 in series. For example, the resistors R21, R14, R15, and R16 may be about 192 kΩ, about 48 kΩ, about 96 kΩ, and about 192 kΩ, respectively, in value, although other resistance values are contemplated by the invention.

In embodiments, the selectable resistor circuit 310 can be used to set a current level into the node VBGR_CLONE to equate the reference supply VBGR_F with a voltage at the node VBGR_CLONE. More specifically, in embodiments, each of the resistors R14, R15, and R16 may be selected to affect (e.g., decrease) the current level at the node VBGR_CLONE. At each selected current level the op-amp 305 adjusts the CNTL_VBGR voltage level to essentially equate the voltage on the node VBGR_CLONE with the input source voltage VBGR_F. The current level into the node VRDC_CLONE may include a value in a range between about 25 microamps (μA) to about 200 μA. More specifically, in embodiments, each of the resistors R14, R15, and R16 may be selected to affect (e.g., decrease, or increase) the current level into node VBGR_CLONE. To select at least one of the resistors R14, R15, and R16, respective digital bits of the digital code FTMVREFB<2:0> may be set. That is, the digital bits FTMVREFB<2>, FTMVREFB<1>, and FTMVREFB<0> may be set to select the resistors R14, R15, and R16, respectively.

More specifically, in embodiments, the inverters 320A and 320B can convert the digital code FTMVREFB<2:0> to the respective analog control-signal voltages VREFB_C<2:0> and VREFB_T<2:0>. When set, these analog signal voltages VREFB_C<2:0> and VREFB_T<2:0> can turn on the transistors T9, T16, T8, T15, T7, and T14, respectively. When the transistors T9, T16, T8, T15, T7, and T14 are turned on, the respective resistors R14, R15, and R16 may be selected (e.g., connected to ground) such that the resistors R14, R15, and R16 may affect the current into the node VBGR_CLONE. As more of the resistors R14, R15, and R16 are selected, the current level into the node VBGR_CLONE increases. As fewer of the resistors R14, R15, and R16 are selected, the current level into the node VBGR_CLONE decreases.

In accordance with further aspects of the invention, regardless of how much current is flowing into the node VBGR_CLONE, the op-amp 305 defines a gate control voltage to control PFET current sources within the current supply circuit 315 such that the voltage on the node VBGR_CLONE is essentially equal to the node VBGR_F. The compensation capacitor C1 may be included to maintain adequate phase margin for the negative feedback loop formed by the op-amp 305, the selectable resistor circuit 310, and the current supply circuit 315 to insure AC stability, i.e., prevent oscillations and allow the voltages and currents associated with the B generator 110 to become DC stable and steady state.

In embodiments, the current supply circuit 315 can include transistors T48, T49, T51, T52, T55, T56, T57, T58, T59, T60, T61, and T62, which may be, e.g., PFETs of a medium channel length, e.g., of about 490 nm. The transistors T58, T56, T48, T51, T60, and T61 may be stacked in series, and may be a first current source 315A which generates a first current to be directed into the node CNTL_VBGR. The transistors T57, T55, T49, T52, T59, and T62 may be stacked in series, and may be a second current source 315B which is identical to the first current source 315A in that the second current source 315B also generates a second current proportional to the current level into the node CNTL_VBGR.

In accordance with further aspects of the invention, in contrast to the first current source 315A, the second current source 315B can reflect the second current into the node DRAIN_B. Although each of the first current source 315A and the second current source 315B is shown herein to include six transistors stacked in series, one of ordinary skill in the art would recognize that each of the first current source 315A and the second current source 315B may include two or more transistors to generate more linear currents. For example, each of the first current source 315A and the second current source 315B may include two transistors of a longer channel length (e.g., of about 2 μm), or whatever length which provides an essentially flat saturation region. Widths of the longer channel length transistors would then be adjusted such that the current requirements of the B generator 110 are satisfied.

In embodiments, the current supply circuit 315 can further include transistors T69 and T70, which may be, for example, PFETs, to improve operation of the first current source 315A and the second current source 315B over a high-to-low current range. More specifically, in embodiments, the transistors T48, T49, T51, T52, T55, T56, T57, T58, T59, T60, T61, and T62 may be sensitive to threshold voltage mismatches at low current levels, as overdrive decreases. Accordingly, at low current levels of the node CNTL_VBGR, the transistors T69 and T70 may act as shunt devices to shunt or short off the transistors T48, T49, T55, T56, T57, and T58, in a high current-mode range, thereby increasing effective PFET widths of the first current source 315A and the second current source 315B. Conversely, in a low current-mode range, the shunt transistors T69 and T70 are turned off causing the effective PFET width to be reduced by inclusion of the transistors T48, T49, T55, T56, T57 and T58. The turn-on and turn-off of shunt devices T69 and T70 is coordinated such that a low effective PFET width is in effect when the current supply circuit 315 is in the low current-mode range.

This may further reduce the effect of threshold voltage mismatches in all of the transistors T48, T49, T51, T52, T55, T56, T57, T58, T59, T60, T61, and T62, and may force the remaining, actively operating transistors to function with higher overdrive. The transistors T69 and T70 may be operated (e.g., turned on or off) by the high-range analog control-signal voltage VREFB_T<2> such that the overdrive of the transistors T51, T52, T59, T60, T61, T62, T48, T49, T55, T56, T57 and T58 is increased for low digital-to-analog (DAC) ranges, such as when the digital code FTMVREFB<2:0> is 1, 0, and 0, respectively.

In accordance with further aspects of the invention, the current supply circuit 315 can further include a resistor R20 connected to the node DRAIN_B and the node VSUM in series. The resistor R20 may modulate a voltage level at the node DRAIN_B, e.g., a drain of the transistor T62 to bias its drain voltage to improve the current matching between the current sources 315A and 315B. The current supply circuit 315 may generate the additional output voltage (e.g., the b voltage) added to the output voltage (e.g., the m voltage) from the M generator 105 already at the node VSUM and across the resistor R13, in FIG. 1. This b voltage may include a range between about 25 mV and about 175 mV, although other ranges and voltage values may be contemplated by the invention.

Figure 4:
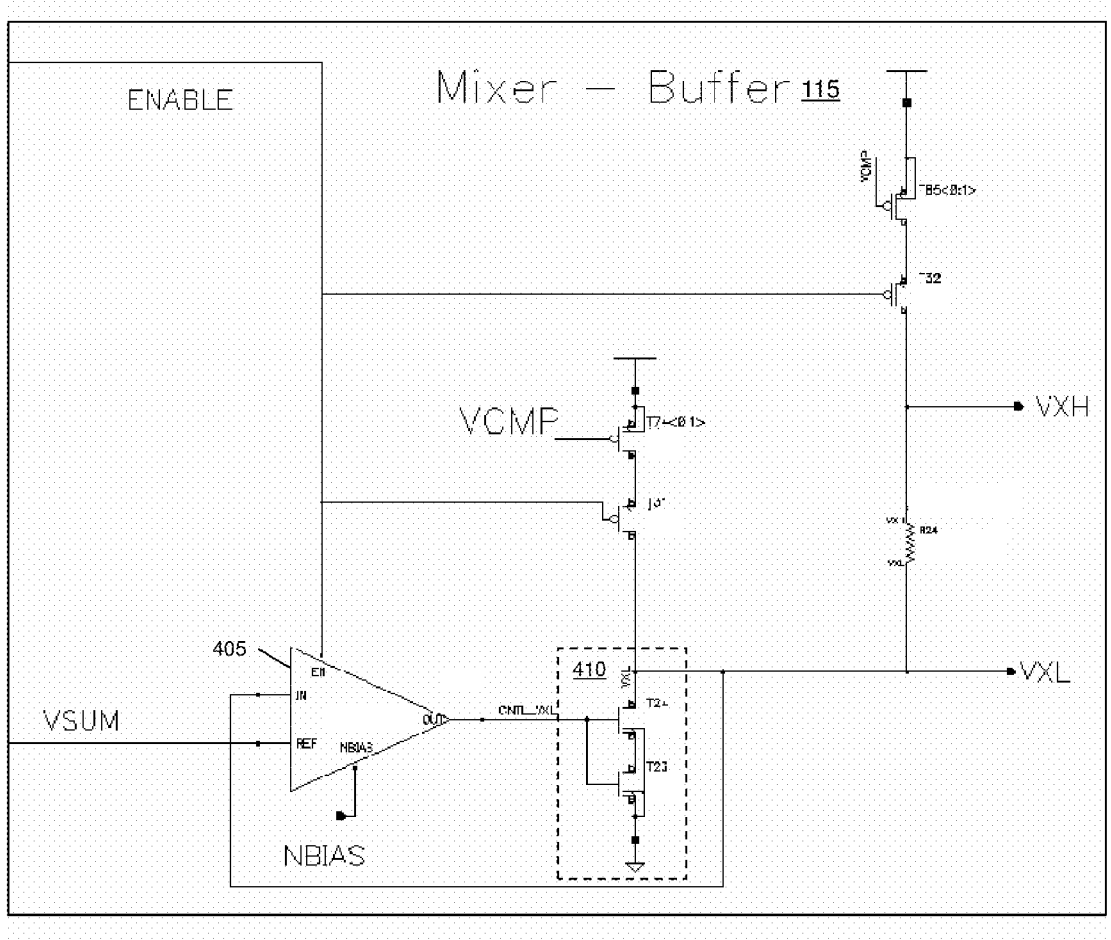
FIG. 4 is an exemplary schematic diagram of a mixer/buffer of the reference generator in FIG. 1 in accordance with aspects of the invention.

FIG. 4 is an exemplary schematic diagram of the mixer/buffer 115 in accordance with aspects of the invention. More specifically, in embodiments, the mixer/buffer 115 can include enable transistors T31 and T32, an operational amplifier (op-amp) 405, a pull-down device 410, transistors T74<0:1> and T85<0:1>, and an output resistor R24. The enable transistors T31 and T32 may be turned on or off by the enable signal voltage ENABLE. In their off states, the enable transistors T31 and T32 may disable the mixer/buffer 115 by disabling current paths from the supply voltage Vdd.

In embodiments, the output voltage at the node VSUM, which is the sum of the m voltage and the b voltage from the M generator 105 and the B generator 110, respectively, can be input into a reference input REF (e.g., an inverting input) of the op-amp 405. The op-amp 405 may be configured as a unity gain buffer amplifier which includes a negative feedback input into a non-inverting input IN of the op-amp 405. A negative feedback loop of the op-amp 405 may further include an output OUT of the op-amp 405 (at a node CNTL_VXL) which is connected to gates of NFET devices T23 and T24 within the pull-down device 410. The op-amp 405 may be turned on or off by the enable signal voltage ENABLE, and may receive the reference supply NBIAS which provides a source current to operate the op-amp 405.

In accordance with further aspects of the invention, since the op-amp 405 is configured as a unity gain buffer amplifier, the op-amp 405 can output an output voltage at the node VXL that is essentially equal to the input voltage at the node VSUM. The transistor T74<0:1> may include a PFET connected to the supply voltage Vdd and to the enable transistor T31 in series. At its gate, the transistor T74<0:1> may receive the PFET current-source control-voltage VCMP which may be about 400 mV less than the supply voltage Vdd, although other voltage values are contemplated by the invention. The PFET current-source control-voltage VCMP may control the transistor T74<0:1> to supply current to the pull-down device 410. By means of the negative feedback loop established by the connections of the op-amp 405, the pull-down device 410 and the current source T74, the output voltage VXL is controlled to be essentially equal to input voltage VSUM.

In accordance with further aspects of the invention, the transistor T85<0:1> can include a PFET connected to the supply voltage Vdd and to the enable transistor T32 in series. At its gate, the transistor T85<0:1> may receive the PFET current-source control-voltage VCMP which may control the transistor T85<0:1> to force a bias current (e.g., of about 25 mA) to a node VXH. This bias current establishes an additional DC offset voltage (e.g., of about 25 mV) at the node VXH such that the node VXH includes the voltage level at the node VXL added by the additional DC offset voltage. The voltage levels at the nodes VXH and VXL create a desired voltage offset (e.g., difference) across the output resistor R24. For example, the desired voltage offset for setting high and low range limits of a reference voltage VREF in an eDRAM may include a value in a range between about 20 mV to about 40 mV, although other ranges and voltage values may be contemplated by the invention.

Figure 5:
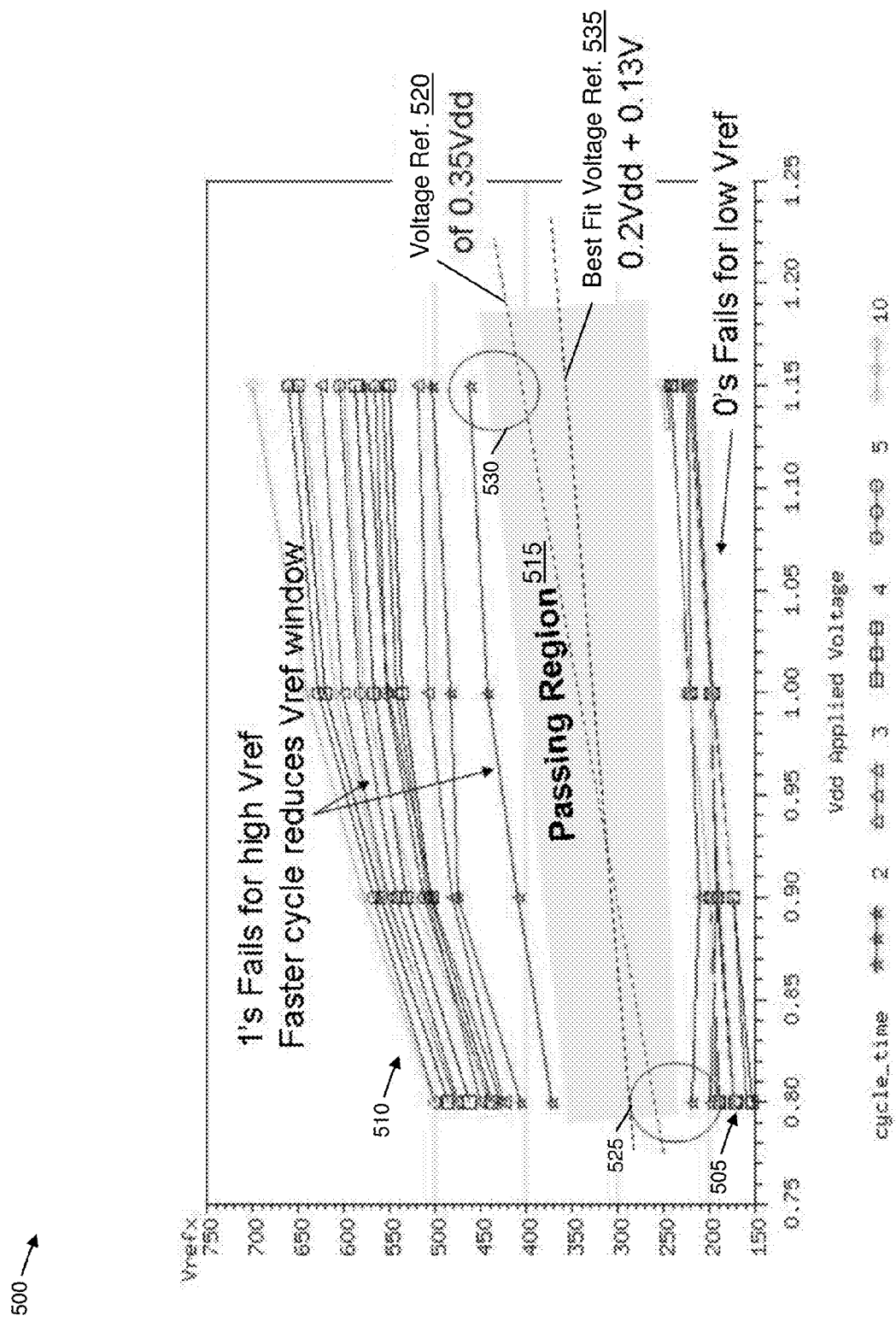
FIG. 5 is an exemplary waveform plot of passing and failing regions of an embedded dynamic random access memory (eDRAM) as a function of applied voltage (Vdd), reference voltage (Vrefx), and cycle time in accordance with aspects of the invention.

FIG. 5 is an exemplary waveform plot 500 of passing and failing regions of a particular embedded dynamic random access memory (eDRAM) as a function of applied (supply) voltage (Vdd), reference voltage (Vrefx), and cycle time in accordance with aspects of the invention. More specifically, in embodiments, the waveform plot 500 includes curves 505 which can represent signal voltages in millivolts (mV) of "0" data types of the eDRAM as a function of the applied voltage in V, and curves 510 which represent signal voltage of "1" data types of the eDRAM as a function of the applied voltage. The "0" signal voltages of the curves 505 may also be a function of the eDRAM cycle time in nanoseconds (ns), and may be, e.g., higher in value at faster cycle times. The "1"

signal voltage of the curves 510 may also be a function of the eDRAM cycle time, and may be, e.g., lower in value at faster cycle times.

In embodiments, the waveform plot 500 can further include a passing region 515 which indicates a region where the reference voltage of a reference generator (e.g., the reference generator 100 in FIG. 1) passes, or can be at a value that produces a difference margin with the "0" or "1" data voltages of the curves 505 and 510. For example, a reference voltage 520 of conventional systems in the passing region 515 may be drawn and used to design a known reference generator. The reference voltage 520 may be generated by a voltage divider, and may be determined based on the equation Vref=0.35*Vdd. The reference voltage 520 may result in values that have difference margins with the "0" and "1" data voltages of the curves 505 and 510. The eDRAM may sense these difference margins to determine whether its cells are of the "0" or "1" data types, e.g., whether the difference margins are greater or less than predetermine thresholds.

However, such difference margins may not be sufficient (e.g., large enough) for the eDRAM to detect the "0" and "1" data types based on the reference and signal voltages. For example, the reference voltage 520 may pinch (e.g., have an insufficient or no margin with) the "0" data voltages of the curves 505 at a region 525 where the applied supply voltage is low in value. In another example, the reference voltage 520 may pinch the "1" data voltages of the curves 510 at a region 530 where the applied supply voltage is high in value. In addition, electrical noise and other factors may further decrease the difference margins between the reference voltage 520 and the "0" and/or "1" data voltages such that the difference margins are pinched at the regions 525 and 530 and the eDRAM may no longer be able to sense the "0" and "1" data types.

In embodiments, instead of the reference voltage 520, a best fit reference voltage 535 can be drawn and used to design a reference generator (e.g., the reference generator 100) in accordance with aspects of the invention. For example, the best fit reference voltage 535 may be determined based on the equation Vref=0.2*Vdd+0.13 V. That is, the best fit reference voltage 535 may be centered about halfway or in the middle between the "0" and "1" data voltages of the curves 505 and 510, and may have a nonzero y-intercept, e.g., 0.13 V. More specifically, the best fit reference voltage 535 may be centered between a maximum "0" data voltage and a minimum "1" data voltage. One of ordinary skill in the art would recognize that the equation and voltages of the best fit reference voltage 535 are only exemplary, and other equations and voltages are contemplated by the invention. Advantageously, the best fit reference voltage 535 may provide sufficient difference margins with the signal voltages of the "0" and "1" data types such that these data types may be sensed by the eDRAM.

Figure 6:
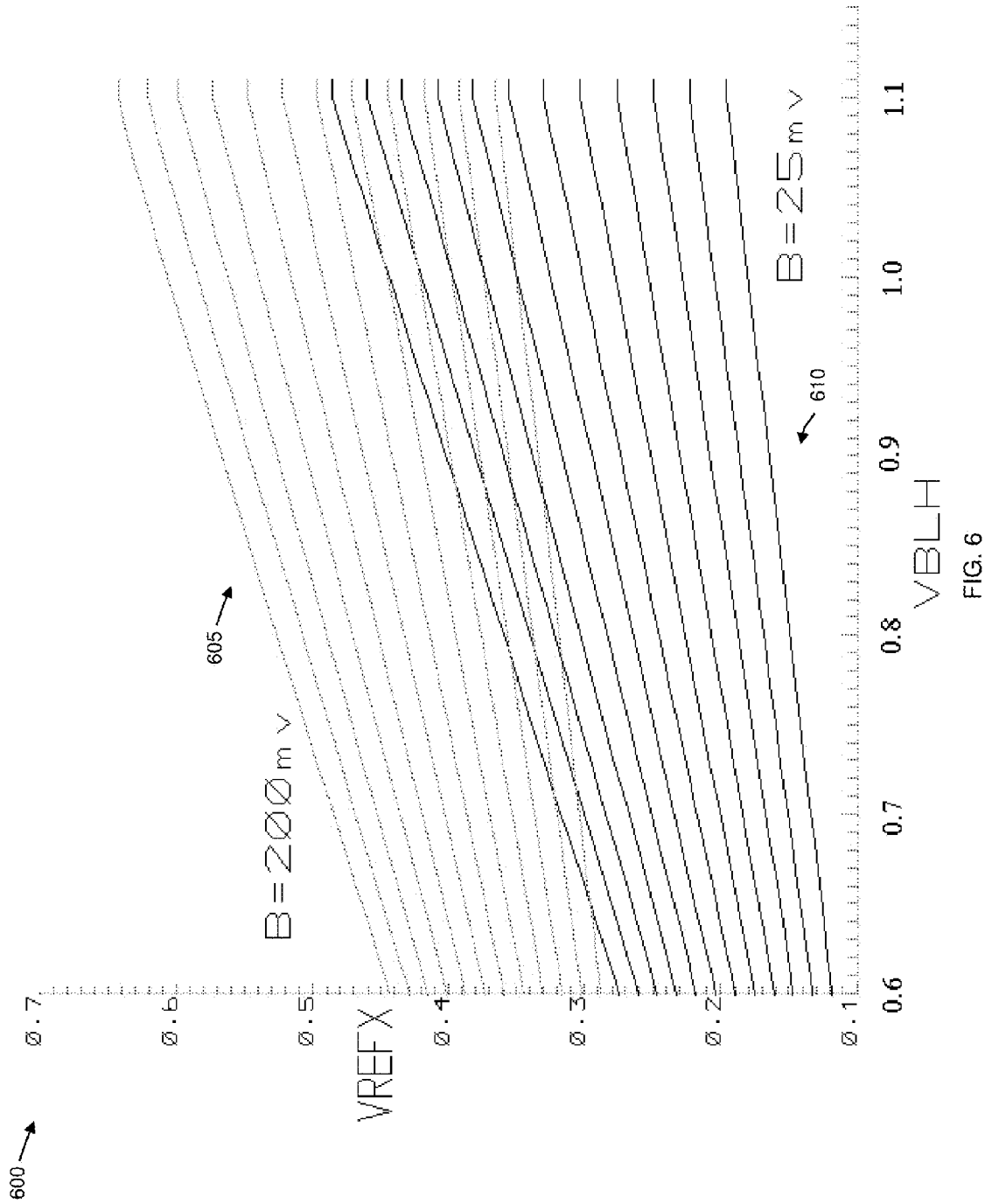
FIG. 6 is an exemplary waveform plot of reference voltage (VREFX) as a function of applied voltage (VBLH) with varying m and b parameters in accordance with aspects of the invention.

FIG. 6 is an exemplary waveform plot 600 of reference voltage (VREFX) as a function of applied bitline voltage (VBLH) with varying m and b parameters in accordance with aspects of the invention. More specifically, in embodiments, the waveform plot 600 can include curves 605 which represent reference voltages in volts (V) as a function of the bitline supply voltage in V. The reference voltages of the curves 605 may include twelve variations of a slope parameter m in a range between about 0.15 to about 0.425, and a parameter b at a value of about 200 mV.

In embodiments, the waveform plot 600 further includes curves 610 which represent reference voltages in V as a function the bitline supply voltage in V. The reference voltages of the curves 610 may include twelve variations of a slope parameter m in a range between about 0.15 to about 0.425, and a parameter b at a value of about 25 mV. One of ordinary skill in the art would recognize that the curves 605 and 610 and their respective slope parameters m and parameters b are only exemplary, and other curves and respective parameters may be contemplated by the invention. In embodiments, with sixteen variations of a slope parameter m, and eight voltage levels of a parameter b (e.g., 128 options), an optimum reference voltage may be found and set by digital-to-analog (DAC) control inputs which are fusible (e.g., linkable) to select or deselect resistors in a reference generator (e.g., the reference generator 100 in FIG. 1) of the present invention. In embodiments, the DAC control inputs may be set to a value to select or deselect the resistors via latches, registers, metal wire programming, etc.

Figure 7:
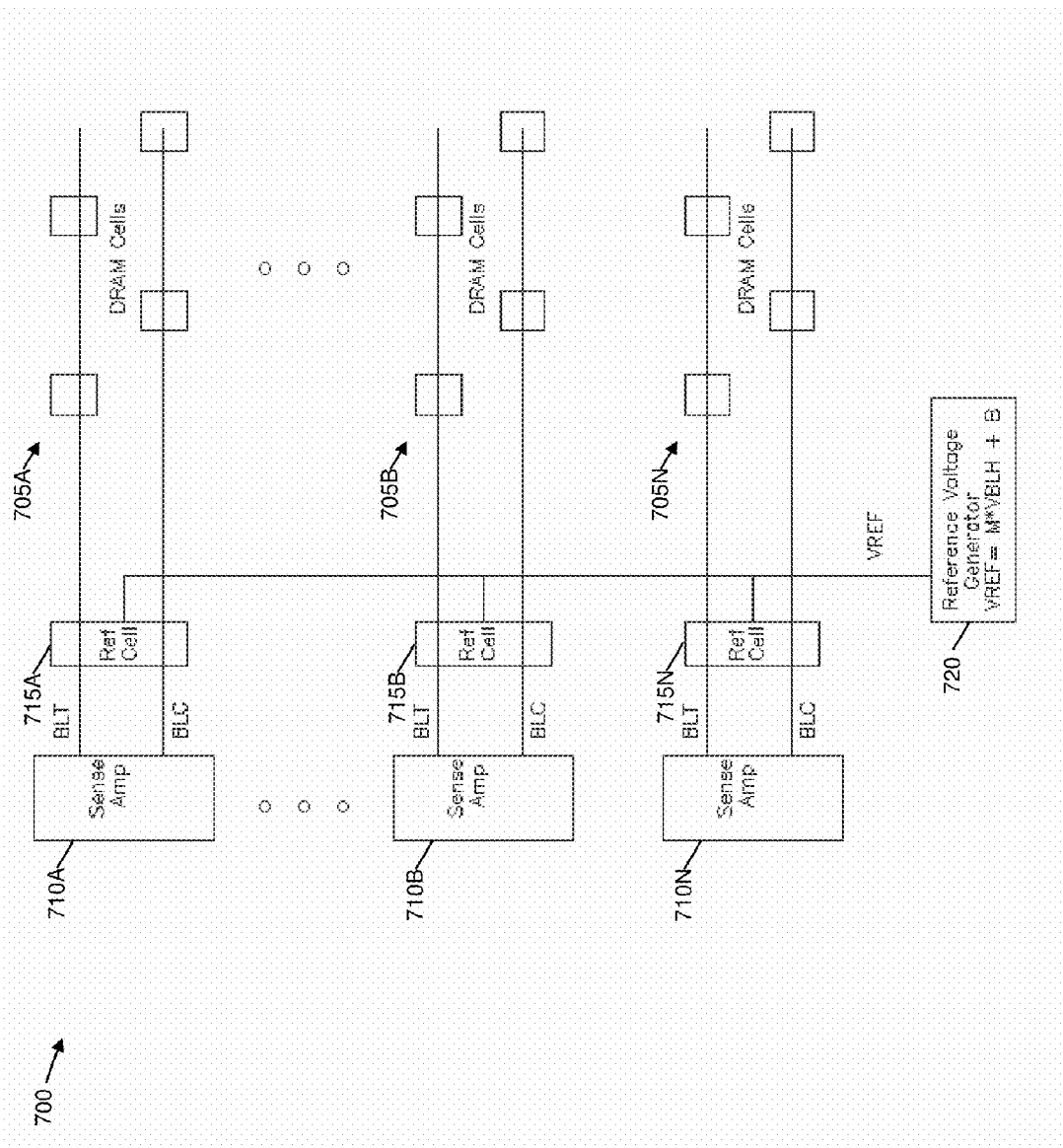
FIG. 7 is an exemplary schematic diagram of a dynamic random access memory (DRAM) with a reference generator with programmable m and b parameters in accordance with aspects of the invention.

FIG. 7 is an exemplary schematic diagram of a dynamic random access memory (DRAM) 700 with a reference generator 720 with programmable m and b parameters in accordance with aspects of the invention. More specifically, in embodiments, the DRAM 700 can include N rows of DRAM cells 705A, 705B, . . . , and 705N. Each row of the DRAM cells 705A, 705B, . . . , and 705N may include at least one DRAM cell connected to a bit line true (BLT) data bit-line, and at least one DRAM cell connected to a bit line complement (BLC) data bit-line. The DRAM 700 may further include N sense amplifiers (amps) 710A, 710B, . . . , and 710N and N reference (ref) cells 715A, 715B, . . . , and 715N, for each respective row of the DRAM cells 705A, 705B, . . . , and 705N. Each of the sense amps 710A, 710B, . . . , and 710N may be connected to the respective BLT and BLC data bit-lines, and may be connected to the reference generator 720 via the respective N reference (ref) cells 715A, 715B, . . . , and 715N.

In operation, for example, the sense amps 710A, 710B, . . . , and 710N can receive data voltage levels of the respective DRAM cells 705A, 705B, . . . , and 705N, via the respective BLT and BLC data bit-lines. In embodiments, these data voltage levels may indicate whether a "1" data type or a "0" data type is stored in each of the DRAM cells 705A, 705B, . . . , and 705N. For the sense amps 710A, 710B, . . . , and 710N to properly sense the data voltage levels on the BLT and BLC data bit-lines, in embodiments, the reference generator 720 (e.g., the reference generator 100 in FIG. 1) may generate an ideal reference voltage VREF (e.g., VREF=M*VBLH+B). This ideal reference voltage VREF is driven to the reference (ref) cells 715A, 715B, . . . , and 715N, each of which provide a final reference voltage level to each of the respective sense amps 710A, 710B, . . . , and 710N. Each of the respective sense amps 710A, 710B, . . . , and 710N may compare the final reference voltage level to each of the data voltage levels on the BLT and BLC data bit-lines, to accurately sense data types stored in the respective DRAM cells 705A, 705B, . . . , and 705N.

Figure 8:
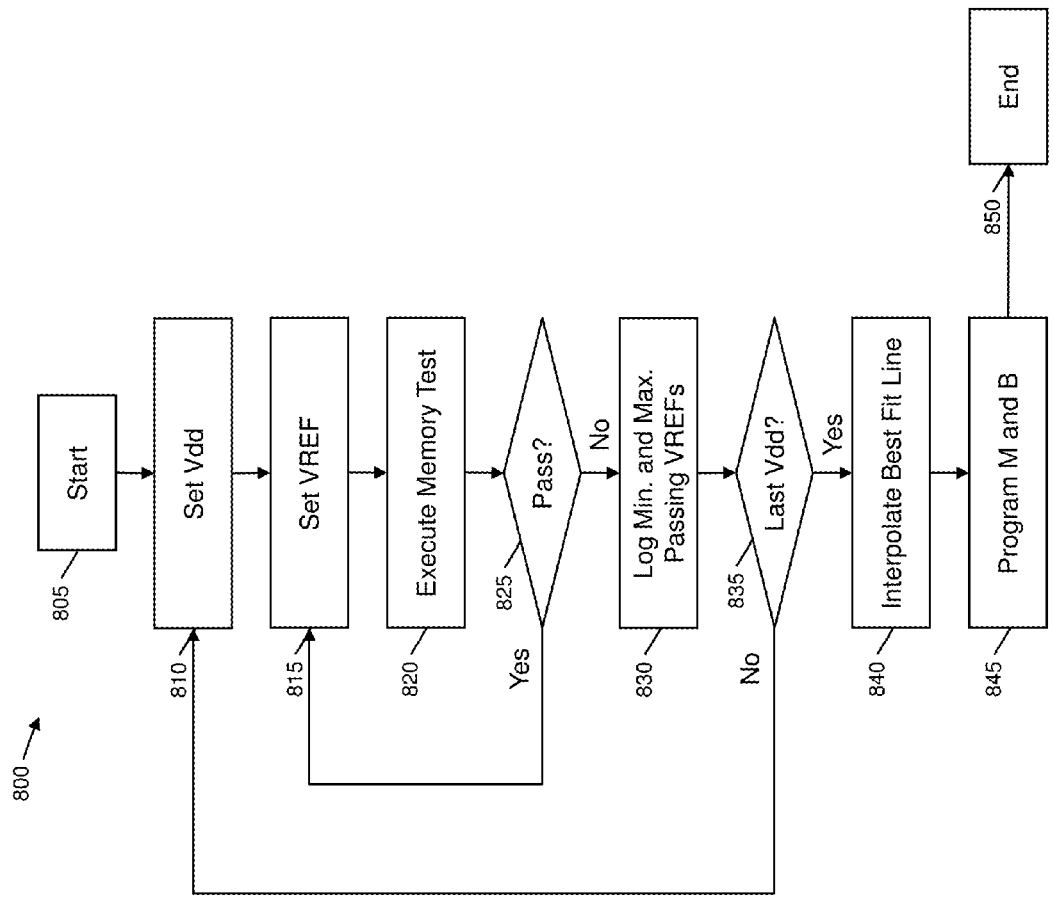
FIG. 8 is an exemplary flow for optimizing device yield in accordance with aspects of the invention.

FIG. 8 is an exemplary flow for a process 800 of optimizing device (e.g., dynamic random access memory (DRAM)) yield in accordance with aspects of the invention. The steps of FIG. 8 may be implemented in a computing environment known in the art, for example. The flowchart and block diagrams in the Figure illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the computing environment known in the art. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

In embodiments, the process 800 can be performed by a computing environment known in the art. At step 805, the process starts. At step 810, a supply voltage Vdd may be set in a semiconductor device (e.g., a DRAM) to be tested and optimized. In embodiments, the supply voltage Vdd may be run in a range of values from a predetermined minimum voltage to a predetermined maximum voltage. One of ordinary skill in the art would recognize that while the supply voltage Vdd is varied in this example, other parameters of the semiconductor device may be varied, such as, for example, temperature and operating speed.

At step 815, a reference voltage VREF can be set in the semiconductor device to be tested and optimized. More specifically, in embodiments, the semiconductor device may require the reference voltage VREF to perform its functionality. For example, a DRAM may require the reference voltage VREF to sense "1" and "0" data types stored in its cells. In this example, the reference voltage VREF may be set to a higher value to accurately sense the "1" data types, and may be to a lower value to accurately sense the "0" data types.

At step 820, a memory test of the semiconductor device can be executed with the set supply voltage Vdd and the set reference voltage VREF. In embodiments, the memory test may define signal voltages of the "1" and "0" data types in an eDRAM. At step 825, it may be determined whether the semiconductor device passes the memory test. For example, a DRAM may pass the memory test when the "1" and "0" data types are accurately sensed based on the set reference voltage VREF. When the semiconductor device passes the memory test, the process returns to step 815. Otherwise, the process continues at step 830.

At step 830, minimum and maximum passing reference voltages (VREFs) can be logged. More specifically, in embodiments, a minimum value of the reference voltage VREF which includes a sufficient voltage margin (e.g., difference) with the signal voltages of the "1" and "0" data types, may be logged. A maximum value of this same reference voltage VREF may also be logged. At step 835, it may be determined whether the supply voltage Vdd is a last supply voltage (e.g., a maximum supply voltage) which may be set. If the supply voltage Vdd is the last supply voltage which may be set, the process continues at step 840. Otherwise, the process returns to step 810.

At step 840, a best fit line for an ideal reference voltage VREF can be interpolated. More specifically, in embodiments, the best fit line for the ideal reference VREF may be interpolated by centering the best fit line between approximately the middle or halfway of the signal voltages of the "1" and "0" data types, as described in FIG. 5. At step 845, based on this best fit line for the ideal reference VREF, m and b parameters of the best fit line may be programmed into a reference generator (e.g., the reference generator in FIG. 1) of the present invention. For example, the m and b parameters may be programmed into the reference generator via fuses between digital-to-analog (DAC) bits and resistors in the reference generator, as described in FIG. 1. At step 850, the process ends.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4 and 7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4 and 7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4 and 7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4 and 7. In one embodiment, design structure 990 may comprise a compiled, executable HDL simulation model that functionally simulates the devices shown in FIGS. 1-4 and 7.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4 and 7. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit comprising:
   a first generator operable to generate a first voltage comprising a fraction of a supply voltage;
   a second generator operable to generate a second voltage; and
   a mixer and buffer circuit operable to output a reference voltage comprising a sum of the first and second voltages, and output a buffered low reference voltage and a buffered high reference voltage based on the sum of the first and second voltages.

2. The circuit of claim 1, wherein the second voltage is independent of the supply voltage.

3. The circuit of claim 1, wherein the mixer and buffer circuit is further operable to generate and output the buffered high reference voltage comprising a sum of the reference voltage and an offset voltage.

4. The circuit of claim 1, wherein the first and second voltages are adjustable by respective digital control words.

5. The circuit of claim 1, wherein the first generator comprises an operational amplifier comprising a negative feedback, and the operational amplifier is operable to buffer the first voltage.

6. The circuit of claim 5, wherein the first generator further comprises a selectable resistor circuit operable to input the first voltage into the negative feedback of the operational amplifier based on digital control words.

7. The circuit of claim 5, wherein the first generator further comprises a current supply circuit operable to increase linearity of a current based on the first voltage.

8. The circuit of claim 1, wherein the second generator comprises an operational amplifier comprising a negative feedback, and the operational amplifier is operable to buffer the second voltage.

9. The circuit of claim 8, wherein the second generator further comprises a selectable resistor circuit operable to input the second voltage into the negative feedback of the operational amplifier based on digital control words.

10. The circuit of claim 8, wherein the second generator further comprises a current supply circuit operable to increase linearity of a current based on the second voltage.

11. A circuit of a dynamic random access memory (DRAM), comprising:
    a reference generator operable to generate a reference voltage comprising a fraction of a supply voltage that is added to a direct current (DC) voltage, the reference voltage being centered between signal voltages of 1 and 0 data types of the DRAM; and
    a sense amplifier operable to sense the 1 and 0 data types based on differences between the reference voltage and the respective signal voltages.

12. The circuit of claim 11, wherein both the fraction of the supply voltage and the DC voltage are adjustable by respective digital control words.

13. The circuit of claim 11, further comprising a plurality of DRAM cells coupled to bit-lines operable to provide the signal voltages to the sense amplifier.

14. The circuit of claim 11, further comprising a reference cell coupled to the reference generator, the reference cell being operable to provide the reference voltage to the sense amplifier.

15. The circuit of claim 11, wherein the reference generator comprises a mixer and buffer circuit operable to:
    add the fraction of the supply voltage to the DC voltage to generate the reference voltage; and
    output the reference voltage to the sense amplifier.

16. The circuit of claim 15, wherein the mixer and buffer circuit comprises an operational amplifier comprising a negative feedback, and the operational amplifier is operable to buffer the reference voltage.

17. The circuit of claim 15, wherein the mixer and buffer circuit is further operable to generate and output a high reference voltage comprising a sum of the reference voltage and an offset voltage.

18. A design structure tangibly embodied in a machine readable memory for designing, manufacturing, or testing an integrated circuit, the design structure comprising:
    a first generator operable to generate a first voltage comprising a fraction of a supply voltage;
    a second generator operable to generate a second voltage; and
    a mixer and buffer circuit operable to output a reference voltage comprising a sum of the first and second voltages, and output a buffered low reference voltage and a buffered high reference voltage based on the sum of the first and second voltages.

19. The design structure of claim 18, wherein the design structure comprises a netlist.

20. The design structure of claim 18, wherein the design structure resides on storage medium as a data format used for the exchange of layout data of integrated circuits.

21. The design structure of claim 18, wherein the design structure resides in a programmable gate array.

22. A method of optimizing semiconductor device yield and performance, comprising:
    defining signal voltages of 1 and 0 data types in a semiconductor device; and
    interpolating a best fit line for a reference voltage to be used by the semiconductor device, the reference voltage comprising a fraction of a supply voltage that is added to a direct current (DC) voltage, and the best fit line being centered between the signal voltages and comprising a slope and an intercept.

23. The method of claim 22, further comprising programming the slope and the intercept into a reference generator of the semiconductor device via respective digital control words.

24. A method in a computer-aided design system for generating a functional design model of a reference generator with programmable m and b parameters, the method comprising:
    generating a functional representation of a first generator operable to generate a first voltage comprising a fraction of a supply voltage;
    generating a functional representation of a second generator operable to generate a second voltage;
    generating a functional representation of a mixer and buffer circuit operable to output a reference voltage comprising a sum of the first and second voltages, the reference voltage being centered between signal voltages of 1 and 0 data types of a dynamic random access memory (DRAM); and
    generating a functional representation of a sense amplifier operable to sense the 1 and 0 data types based on differences between the reference voltage and the respective signal voltages.

25. The method of claim 24, wherein:
    the second voltage is independent of the supply voltage;
    the mixer and buffer circuit is further operable to generate and output a high reference voltage comprising a sum of the reference voltage and an offset voltage; and
    the first and second voltages are adjustable by respective digital control words.

26. The method of claim 24, wherein the first voltage is a slope of the reference voltage with respect to a supply voltage; and the second voltage is a predetermined intercept of the reference voltage at the supply voltage of 0.

27. The method of claim 1, wherein the first generator and the second generator each include an operational amplifier, a selectable resistor circuit, and a current supply circuit, and the first generator includes a voltage divider circuit.

\* \* \* \* \*